(12) United States Patent
Quinn

(10) Patent No.: US 7,271,457 B2
(45) Date of Patent: Sep. 18, 2007

(54) ABRUPT CHANNEL DOPING PROFILE FOR FERMI THRESHOLD FIELD EFFECT TRANSISTORS

(75) Inventor: Robert M. Quinn, Bristow, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 85 days.

(21) Appl. No.: 11/071,196

(22) Filed: Mar. 4, 2005

(65) Prior Publication Data

US 2006/0197121 A1  Sep. 7, 2006

(51) Int. Cl.
  *H01L 29/76*  (2006.01)
  *H01L 29/94*  (2006.01)
  *H01L 31/062*  (2006.01)
  *H01L 31/113*  (2006.01)
  *H01L 31/119*  (2006.01)

(52) U.S. Cl. .................. 257/403; 257/404; 257/407

(58) Field of Classification Search ............... 257/288, 257/403–407
See application file for complete search history.

(56) References Cited

U.S. PATENT DOCUMENTS

| | | | |
|---|---|---|---|
| 4,108,686 A | 8/1978 | Jacobus, Jr. | |
| 4,583,105 A | 4/1986 | Rosenberg | |
| 4,835,112 A | 5/1989 | Pfiester et al. | |
| 4,841,346 A | 6/1989 | Noguchi | |
| 4,928,156 A | 5/1990 | Alvis et al. | |
| 4,984,043 A | 1/1991 | Vinal | |
| 4,990,974 A | 2/1991 | Vinal | |
| 5,151,759 A | 9/1992 | Vinal | |
| 5,194,923 A | 3/1993 | Vinal | |
| 5,298,435 A | 3/1994 | Aronowitz et al. | |
| 5,369,295 A | 11/1994 | Vinal | |
| 5,633,177 A | 5/1997 | Anjum | |
| 5,798,555 A | 8/1998 | Mishra et al. | |
| 6,150,680 A | 11/2000 | Eastman et al. | |
| RE37,158 E | 5/2001 | Lee | |
| 6,225,176 B1 | 5/2001 | Yu | |
| 6,555,872 B1 | 4/2003 | Dennen | |
| 6,833,556 B2 | 12/2004 | Grupp et al. | |
| 2001/0011750 A1 | 8/2001 | Yamazaki et al. | |
| 2001/0030349 A1 | 10/2001 | Lin et al. | |
| 2005/0012146 A1 | 1/2005 | Murthy et al. | |
| 2006/0138548 A1* | 6/2006 | Richards et al. ............ 257/368 |

FOREIGN PATENT DOCUMENTS

EP    0 803 911 A2   10/1997

OTHER PUBLICATIONS

Terauchi et al., "Suppression of the Floating-Body Effects in SOI MOSFETs by Bandgap Engineering", Symposium of VLSI Technology Digest of Technical Papers, Kyoto, Japan, Jun. 1995, pp. 35-36; see abstract.
PCT International Search Report dated Dec. 14, 2006 of International Application No. PCT/US06/07467 filed Mar. 2, 2006.

* cited by examiner

*Primary Examiner*—Thien F Tran
(74) *Attorney, Agent, or Firm*—Snider & Associates

(57) ABSTRACT

A Fermi threshold voltage FET has Germanium implanted to form a shallow abrupt transition between the semiconductor substrate dopant type, or well dopant type, and a counter doping layer of opposite type closely adjacent the surface of the semiconductor substrate. Germanium is a charge neutral impurity in silicon that significantly reduces the diffusion motion of other impurity dopants, such as As, P, In, and B in the regions of silicon where Ge resides in significant quantities (i.e. greater than 1E19 cm sup3).

4 Claims, 3 Drawing Sheets

ABRUPT CHANNEL DOPING PROFILE FOR FERMI THRESHOLD FIELD EFFECT TRANSISTORS

BACKGROUND OF THE INVENTION

1. Field of the Invention

This invention relates to Fermi threshold Field Effect Transistors and more particularly to a Fermi threshold Field Effect Transistor (FET) with an abrupt channel doping profile and a low cut-off current flow.

2. Description of the Background

As will be appreciated by those skilled in the art, Fermi threshold, FETs are described in U.S. patents issued to Albert W. Vinal, including the following patents, which are incorporated herein by reference: U.S. Pat. Nos. 4,984,043; 4,990,974; 5,194,923; and 5,151,759. As in a conventional Metal On Oxide FET, the Fermi threshold FET has a source electrode, a drain electrode, a semiconductor channel between the source and drain where conduction can take place, and an insulated gate electrode which controls conduction in the semiconductor channel. The threshold voltage of an FET is the value of gate voltage needed to initiate device conduction. In a Fermi threshold FET of the type described in the above referenced patents, and to which this invention applies, the threshold voltage is set to twice the Fermi potential. The Fermi potential is that potential for which a semiconductor material has a probability of one half of being occupied by an electron. The criteria and equations for determining the parameters of a Fermi threshold FET, such as channel doping concentrations and depth, and source and drain doping, and gate structure for both N channel and P channel Fermi threshold FETs are described in the above referenced patents.

FIGS. 1 and 2 illustrate a conventional CMOS NFET with a uniform channel dopant. It will be understood that the same considerations apply to conventional PFETs and for more complex dopant profiles, such as retrograde well dopant structures. FIG. 1 shows a surface channel region of an NFET with its dopant concentration shown vertically and the depth from the wafer surface shown horizontally. The channel dopant is constant at 1E17 cm super3 of, in this example, Boron, which is consistent with the dopant level required for a 0.15 μm NFET device. When a positive bias is applied to the gate electrode, the surface of the silicone is depleted of its excess hole carriers, and the surface potential rises, as illustrated in FIG. 2. As the gate voltage is further increased, the surface depletion reaches a point where electrons begin accumulating at the surface of the wafer, forming an inversion layer, and conduction begins between the source and drain of the NFET. Because of the uniform dopant concentration in the wafer throughout the depletion region, the electron layer that forms is constrained by a large vertical electric field so that it is contained in a narrow region at the wafer surface (a few nm depth).

FIGS. 3 and 4 illustrates a prior art CMOS Fermi threshold FET. Source and drain regions are formed in the semiconductor substrate, typically a silicone bulk substrate, as illustrated in FIG. 3, or the substrate may be an epitaxial layer or a "tub" region formed in the bulk substrate. The source and drain regions are of the conductivity type opposite from the conductivity type of the substrate region itself, and have a higher donor concentration. Electrodes form external contacts for these regions. A thin gate oxide layer is formed on the surface of the substrate and a polysilicon gate contact is formed on the gate oxide, with a metal gate electrode. The substrate contact region is typically of the same conductivity type as the substrate but more highly doped. The Fermi channel has the same conductivity type as the source and drain and the opposite conductivity to the substrate. As will be appreciated by those skilled in the art, the depth and donor concentration of the Fermi channel are critical in forming a Fermi threshold FET.

Good performance of a Fermi threshold FET requires that a counter-doping layer (i.e. a layer doped opposite to the conventional channel doping) be inserted at the wafer surface. This counter-doping layer should have a very abrupt transition form the counter-doping layer impurity type to the conventional channel doping impurity type over a very short distance and the transition should be very close to the wafer surface. The counter-doping layer reduces the potential gradient, or reverse electric field, in the channel region in the silicon surface layer. FIG. 4 shows how the Fermi threshold FET has an altered electric field compared with that illustrated in FIG. 2. The Fermi threshold FET implements a narrow, abruptly terminated region of a dopant type opposite to the substrate (in the case illustrated here, N-type). This dopant region should be at a concentration level and depth such that all of the N-type dopant is depleted by the built-in potential of the N-P junction that forms because of N-type layer at the surface of the P-type substrate. This results in a surface region where any gate electrode voltage applied begins to build an inversion layer, and cause conduction between source and drain. An FET with such a very low threshold voltage (V subt) has a leakage current in its off (zero V subt) state. To lower the off state leakage current, the device V subt is increased by changing the work function of the gate electrode material. A gate electrode with a work function near the middle of the silicon band gap will increase the device Vsubt by 0.5 volts. Materials such as Tungsten (W) and Titanium Nitride (TiN) have such a work function. As illustrated in FIG. 4, to achieve a low cut off current, the entire potential distribution of the built-in junction in the silicon region should be contained in a shallow region near the wafer surface. This Fermi threshold device has a higher performance than the typical surface channel device because, as the channel turns on, the carriers are not constrained to flow up against the silicon surface as tightly, due to a lower vertical electric field at the surface compared with the uniform doped case illustrated in FIGS. 1 and 2. When the channel of the Fermi-FET is turned on, the charge carriers will flow through a deeper channel region and are not constrained to flow up against the silicon surface under the gate oxide where their mobility is degraded by surface scattering and high volume charge density effects. The effect of the counter-doping layer potential change on the device threshold voltage is counter balanced by a change in the gate electrode material work function. Moving the work function toward a mid-silicon band gap with a material such as W or TiN will restore the desired device threshold voltage.

The problem with extending the channel region depth into the wafer away from its surface is that when the gate electrode turns off the source drain current, the depth must not be so grate that the cannot adequately reduce the source drain current. Off state leakage current in a Fermi threshold FET is the source to drain current flowing in the FET when the gate voltage is zero. A criteria for a high performance FET is an off state leakage current of 1E–6 times the on state current, that is, the source drain current flowing with the Vdrain=Vgate=Vsupply. Gate electrode control when the gate electrode voltage is zero is key to limiting the leakage current. A problem in the Fermi threshold FET, with a counter doped channel, is the channel region extends into the wafer away from the wafer surface. Control of the lower boundary of the channel region in prior art Fermi threshold FETs has not been satisfactory in limiting the number charge carriers beyond the depth where the gate electrode can adequately reduce the source-drain current.

There have been prior art proposals to use Germanium as a charge neutral impurity in Silicon in order to reduce the diffusion motion of other impurity dopants in regions where the Ge resides, see for example U.S. Pat. Nos. 4,835,112, RE37,158, and 5,298,435. But these proposals do not address the problem of leakage current in the Fermi threshold FET with a counter doped channel region.

An object of this invention is the provision of an FET with a Fermi threshold voltage with high performance and low leakage current.

Another object of this invention is the provision of a method to form a shallow abrupt dopant transition region between the substrate, or well dopant type, and the surface counter doping layer of opposite type, with sufficient control to obtain the desired Fermi threshold voltage, low leakage current and high performance.

BRIEF DESCRIPTION OF THE INVENTION

Briefly, this invention contemplates Fermi threshold voltage FET in which Germanium is ion implanted to form a shallow abrupt transition between the substrate, or well dopant type, and a surface counter doping layer of opposite type. Germanium is a charge neutral impurity in silicon that significantly reduces the diffusion motion of other impurity dopants, such as As, P, In, and B in the regions of silicon where Ge resides in significant quantities (i.e. greater than 1E19 cm sup3). The dopant impurities of interest to this invention are those which can be used for fabricating a dopant layer of opposite type to the main channel type dopant. This is B or In for a PFET surface channel device, and P, Sb, or As in and NFET surface channel device.

DETAILED DESCRIPTION OF THE INVENTION

Figure 1:
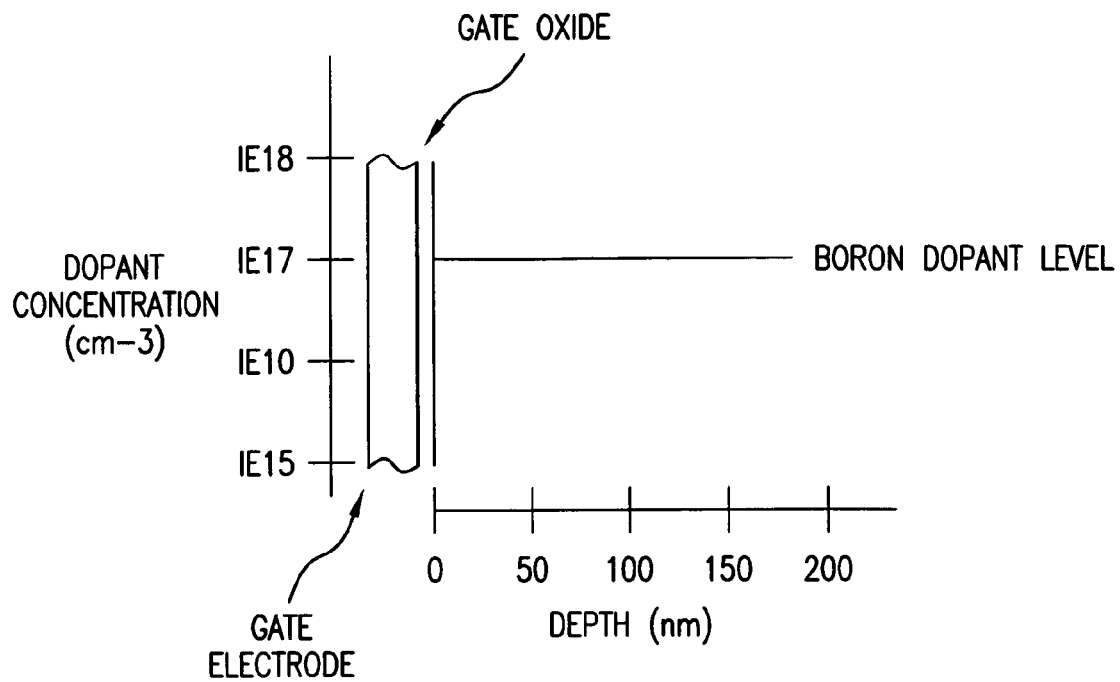
FIG. 1 is a diagram illustrating a doping profile for the conducting channel in a simple prior art FET
Figure 2:
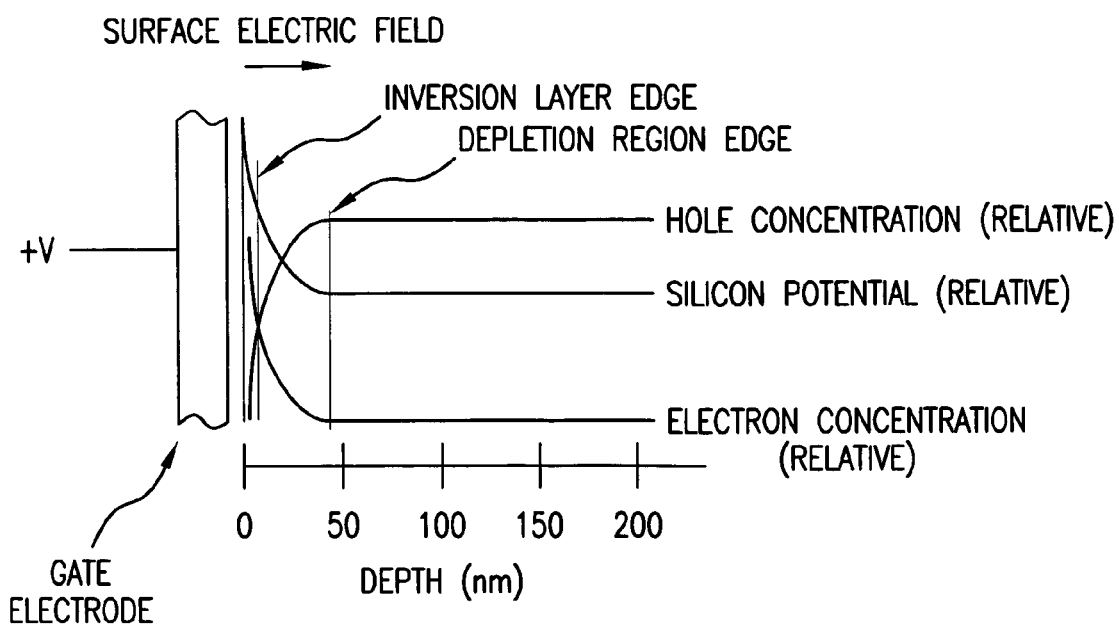
FIG. 2 is a diagram illustrating certain characteristics in the operation of a conventional prior art FET with a doping profile shown in FIG. 1.
Figure 3:
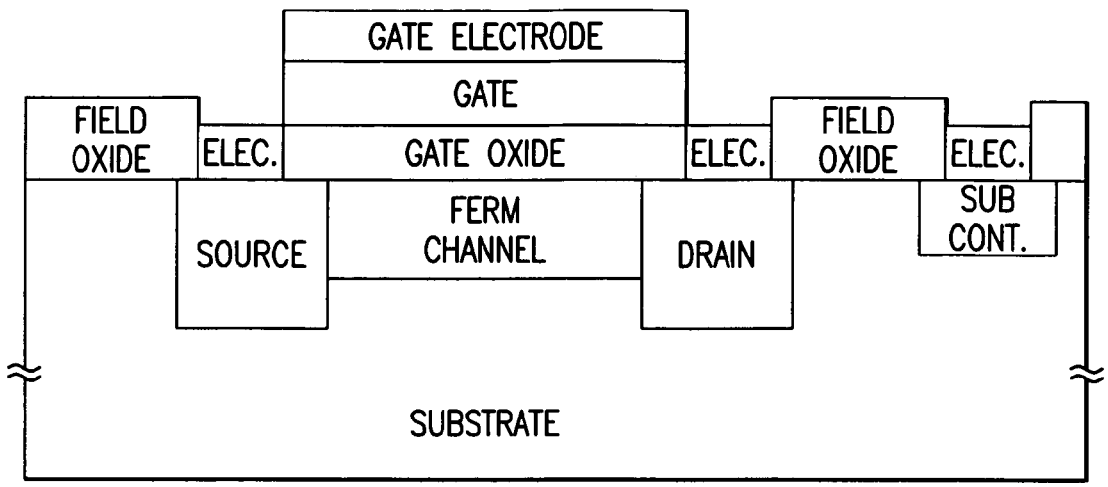
FIG. 3 is a schematic cross sectional view a Fermi threshold FET.
Figure 4:
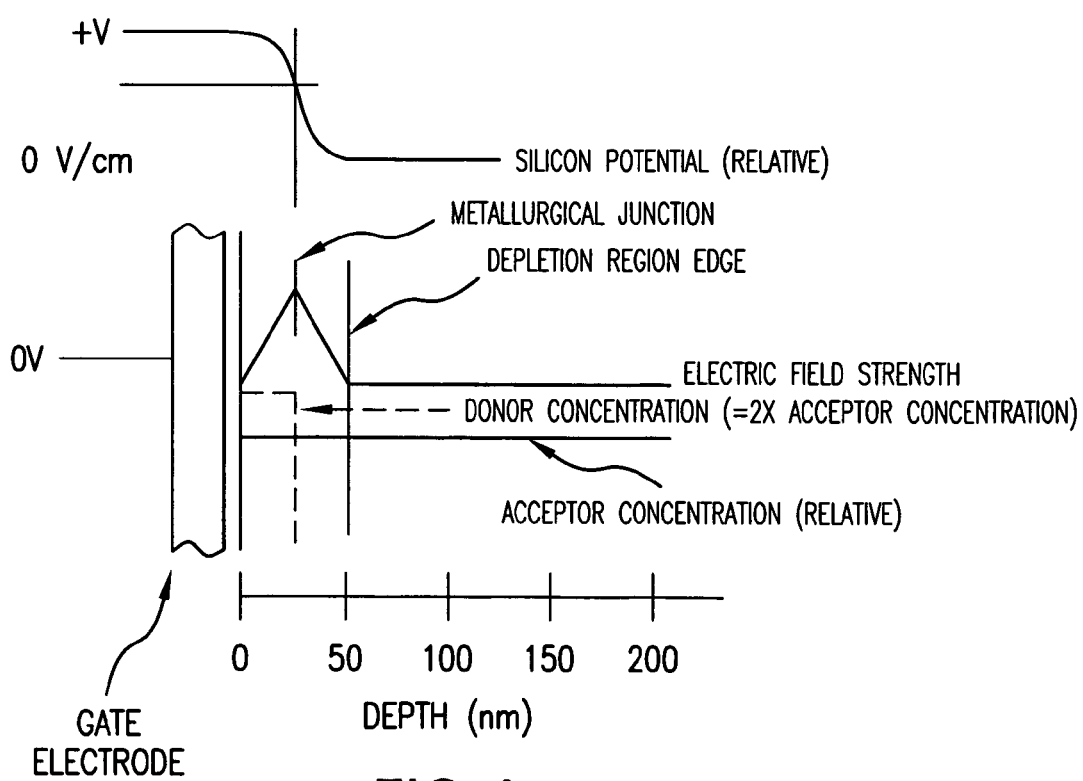
FIG. 4 is a diagram illustrating certain characteristics of the operation of a Fermi threshold FET.
Figure 5:
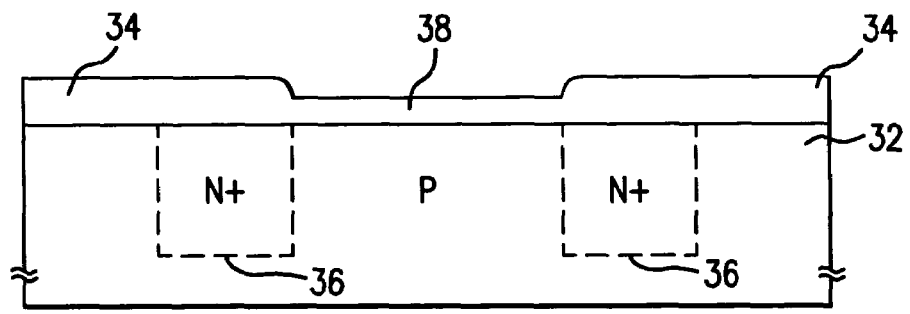
FIG. 5 is a cross sectional view of wafer with an oxide layer of reduced thickness gate region where a Fermi channel is to be formed.

Referring now to FIGS. 5 through 8, a preferred method of the invention is to use ion implantation to structure, closely adjacent the wafer surface, a layer of counter dopant material with an abrupt transition between the layer and under lying wafer. FIG. 5 shows a substrate wafer region 32 for an NFET in which the wafer has been lightly doped with a P type dopant, such as Boron, or has in it a Boron doped P well. As illustrated, the surface of the wafer has had formed on it a relatively thick oxide layer 34 covering the regions 36 where the source and drain are to be formed. In the gate region, where a Fermi channel is to be formed, the oxide layer has been masked and etched to form a thin oxide layer 38. While this specific example illustrates the steps in forming an NFET, it will be appreciated that the same process may be employed for PFETs using opposite dopant types.

Figure 6:
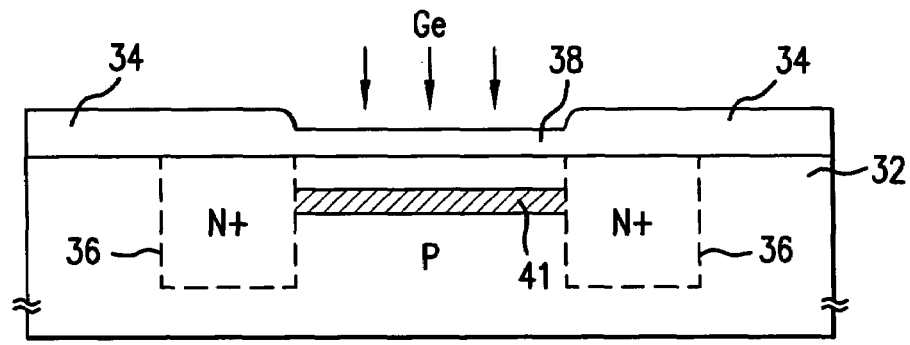
FIG. 6 is a cross sectional view of the wafer in FIG. 5 in the process of forming a Ge region in the wafer.

Referring now to FIG. 6, Germanium is implanted into the wafer so that it has a well-defined peak concentration range, indicated at 41, about 40 nm below the surface of the wafer, which is depth to which the counter dopant should be contained. Confining the Ge to substantially a narrow peak range allows the counter dopant to diffuse in the silicon in the region between the peak range of the Ge and the wafer surface when the counter dopant is implanted in a subsequent step. For example, a Ge ion implant through the screen oxide 38 of about 12 nm with a dosage of 5E14 to 1E15 Ge atoms/cm2 at about 45 KeV will implant Ge ions in the silicon lattice with a well defined peak concentration of Ge ions about 40 nm the silicon surface. Any dopant impurities implanted closer to the surface than the Ge peak ion concentration will diffuse into but be constrained within that shallow 40 nm layer. As will be appreciated by those skilled in the art, Ge is a neutral impurity in silicon, being also from the Group IV elements of the period table. Ge does not contribute dopant ions or mobile carriers in silicon. This allows Ge to be used as a shallow barrier to either N-type or P type impurities, and can be used to form very shallow counter doped barriers in the surface regions of both Fermi threshold NFET and PFET devices.

After the Ge implantation, the wafer preferably is annealed by heating it to greater than 500° C. degrees for approximately 30 minutes in order to anneal out implant damage.

Figure 7:
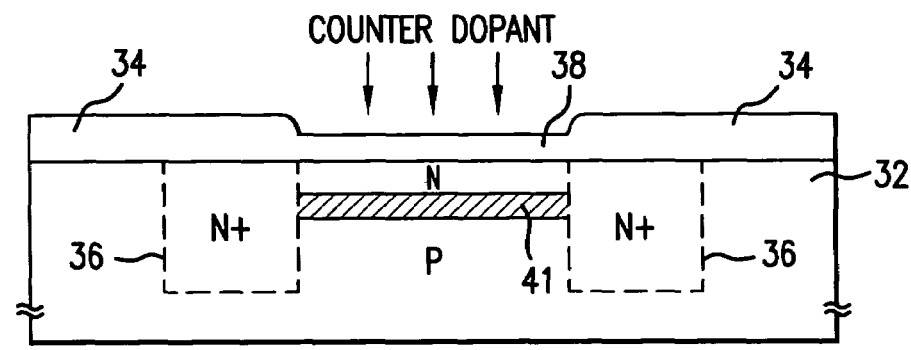
FIG. 7 is a cross sectional view of the wafer in FIG. 6 in the process of forming a counter doped channel.

The counter dopant step illustrated in FIG. 7 can be carried out using suitable prior art ion implantation technology. In the illustrated embodiment, Arsenic or Antimony is used as counter dopant materials to form a counter dopant Fermi channel 43. Arsenic and Antimony are N-type dopants with low but finite diffusions in silicon.

Figure 8:
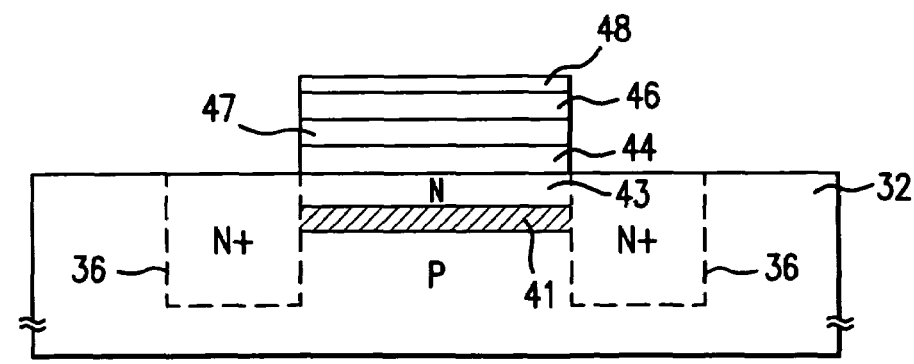
FIG. 8 is a cross sectional view of the wafer in FIG. 7 with a gate structure in place.

FIG. 8 a stage of the exemplary device with the gate structure in place. The gate electrode is a two-layer structure comprised of a suitable mid-band-gap conductor layer 47 such as TiN to set an appropriate Fermi threshold voltage ($V_T$) of, for example, 0.5 volts and a layer 46 of conventional polysilicon. The gate electrode is formed on a gate oxide layer 44, and metal silicide contact resistance lowering layer 48 is formed on top of the gate structure.

The invention claimed is:

1. A Fermi type field effect transistor comprising in combination:
    a semiconductor having a surface;
    a source region and a drain region formed in said semiconductor;
    a counter doped channel in said semiconductor confined to a region extending from said surface to a depth of about 40 nanometers from said surface and extending between said source region and said drain region;
    said semiconductor having formed therein a barrier to diffusion of counter dopant material starting at a depth of about 40 nanometers from said surface, and
    a gate formed on said surface that controls conduction in the counter doped channel, said gate having a work function that initiates conduction in said counter doped channel at a voltage equal to twice the Fermi potential and that creates a depletion region in said counter doped channel adjacent said surface.

2. A Fermi type field effect transistor as in claim 1 wherein said barrier is comprised of Germanium.

3. A Fermi type field effect transistor as in claim 2, wherein said gate includes a mid-gap-conduction layer.

4. A Fermi type field effect transistor as in claim 1, wherein said gate includes a mid-gap-conduction layer.

* * * * *